United States Patent [19]

Jones et al.

[11] 4,039,936
[45] Aug. 2, 1977

[54] INTERLEAVED MAGNETORESISTIVE DISPLACEMENT TRANSDUCERS

[75] Inventors: Alan Lytton Jones; Joseph Paul Pawletko, both of Endwell; Jerry Wesley Raider, Endicott, all of N.Y.

[73] Assignee: International Business Machines Corporation, Armonk, N.Y.

[21] Appl. No.: 673,824

[22] Filed: Apr. 5, 1976

[51] Int. Cl.$^2$ .......................................... G01R 33/12
[52] U.S. Cl. .................................. 324/34 D; 324/46; 338/32 R
[58] Field of Search ........... 324/34 D, 34 PS, 34 GT, 324/46; 338/32 R, 32 H

[56] References Cited

U.S. PATENT DOCUMENTS

| 3,846,697 | 11/1974 | Cila et al. | 324/34 GT |
| 3,852,661 | 12/1974 | Szabo et al. | 324/34 PS |
| 3,934,160 | 1/1976 | Borcke | 324/34 PS |

Primary Examiner—Robert J. Corcoran
Attorney, Agent, or Firm—Kenneth P. Johnson

[57] ABSTRACT

Magnetoresistive displacement transducer arrangement for toothed magnetic members in which each transducer is formed by a pair of interconnected sections spaced from each other by the width of a tooth to provide greater change and improved symmetry in the output signal at the tooth edges. Multiple transducers can be positioned interdigitally for compact packaging for vernier type detection of motion. Transducer embodiments for both linear and rotary motion are disclosed.

4 Claims, 19 Drawing Figures

INTERLEAVED MAGNETORESISTIVE DISPLACEMENT TRANSDUCERS

BACKGROUND OF THE INVENTION

Motion or displacement transducers of the two-terminal magnetoresistive type are well known. These devices employ a semi-conductor material whose electrical resistance increases in the presence of a magnetic field. This characteristic is exploited in detecting the presence or variation of magnetic flux fields produced either by current flow or relative motion in the magnetic fields of electromagnets or permanent magnets. Examples of magnetoresistive transducer arrangements are described in such U.S. Pat. Nos. as: 3,853,377; 3,753,202; 3,267,405, 3,260,932, and 3,172,032.

These patents generally disclose transducer configurations for detecting motion relative to a magnetic field and techniques for obtaining controlled output signals. In each of these arrangements, the output capabilities of the transducers severely limit positional accuracy because of gradual change of the flux fields, the generally low signal levels, and sensitivity of the semiconductors to gap and temperature variations. The semiconductor devices need effective flux concentration and their output signals usually require amplification, even though biased to the sensitive portion of the response curve.

These limitations have hampered adaptation of the magnetoresistors as indicators of small displacements. For instance, when the devices are used to detect displacement along a toothed member of relatively small pitch, the magnitude of the output signal tends to distort and produce an asymmetrical waveform as the device approaches and crosses tooth surfaces and edges, because of the fringing flux. The effect of this deficiency has been diminished by using center-tapped or dual magnetoresistors in a bridge circuit, but there remains sufficient distortion to make accurate position deflection difficult and uncertain.

OBJECTS AND SUMMARY OF THE INVENTION

It is accordingly a primary object of this invention to provide a transducer arrangement of magnetoresistors for toothed members which produces substantially symmetrical output signals that reliably sense and indicate tooth edges.

Another object of this invention is to provide a magnetoresistive transducer apparatus for toothed elments that produces output signals having greater slope or rate of change at the tooth edges.

Another object of this invention is to provide magnetoresistive transducer structure for toothed members that is inexpensive to manufacture, provides improved signal output and achieves greater positional accuracy.

A still further object of this invention provides magnetoresistive transducers that can be interdigitated for compact packaging of multiple transducers while maintaining reliable, accurate, individual operation.

Another object of this invention is to provide a displacement transducer of magnetoresistive material comprising two sections serially connected across a voltage source and positioned from each other at one-half the tooth pitch.

The foregoing objects are attained in accordance with the invention by providing adjacent the teeth of a toothed member of ferromagnetic properties means for producing magnetic flux fields that vary in accordance with the presence and absence of said teeth and transducer means movable through said varying field, including a pair of sections of magnetoresistive material arranged transversely with respect to the direction of motion and serially joined and connected across a voltage source. A center tap at the junction of the series connected magentoresistive semiconductors provides an output indicative of position that can be used with conventional threshold detection devices to indicate the approach or passage of a tooth edge on said member.

The pair of magnetoresistive sections or devices comprising each transducer are preferably of the same configuration and have the same characteristics in a magnetic flux field. The transducer sections can be etched to achieve small size as are printed circuits and they can be formed in an interdigitated or interlaced pattern so that multiple transducers can be used in an extremely compact vernier arrangement. The arrangement can be used interchangeably for either a linear or a rotary toothed member. There are also the advantages of not being affected by accumulation of dirt as with optical devices, and decreased sensitivity to operating vibrations.

DESCRIPTION OF PREFERRED EMBODIMENTS

Figure 1:
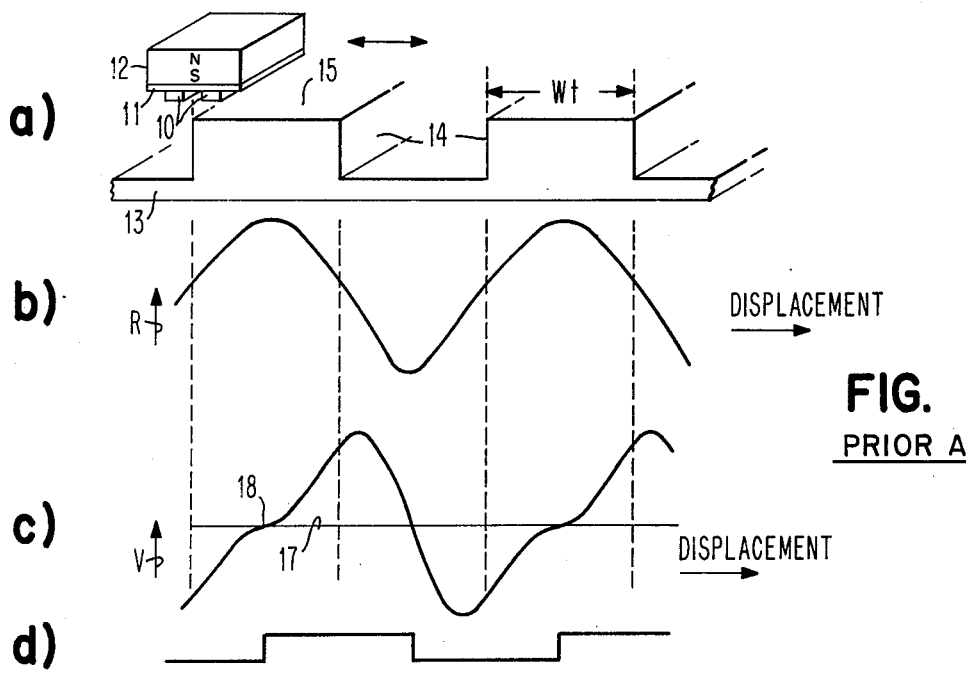
FIGS. 1a–1d are diagrams of a magnetoresistive transducer arranged to sense rack teeth and the resistance and voltage waveforms resulting therefrom as used in the prior art.

Referring to FIGS. 1a–1d, a magnetoresistive transducer arrangement from the prior art is shown. The transducer 10 having a support base 11 of relatively high resistance is secured to the underside of a permanent magnet 12, which is, in turn, supported for reciprocating motion relative to rack 13 having teeth 14. Transducer 10 is usually a semiconductor material such as indium antimonide-nickel antimonide formed in either a rectangular, meander or serpentine configuration and supported for movement closely adjacent the surfaces 15 of the teeth. The separation between tooth and transducer is generally 0.5 mm. or less. The magnetoresistive material displays increased resistivity with increasing magnetic flux density and as the permanent magnet and transducer move across the surface of the rack, a ferromagnetic material, the magnetic flux field established between the permanent magnet and rack will vary in density depending upon whether there is a tooth or space adjacent the transducer. By connecting the transducer across a source of voltage and detecting the change in voltage drop across the transducer, an indication of the transducer resistance is obtained such as that illustrated in FIG. 1b. Transducer 10 illustrated in FIG. 1a is U-shaped and has a center tap at the base of the U so that the transducer is in effect a pair of rectangular, equal resistors in a voltage divider network. The center tap voltage signal is shown in FIG. 1c. The center tap can be connected to a comparator circuit and, in the embodiment shown, the comparator produces a square wave output voltage signal as indicated in FIG. 1d.

It will be noted from FIG. 1c that the output signal obtained from transducer 10, as it crosses a tooth and space comprising one tooth pitch, is distorted tending to be flat at the mid-point of the tooth at reference value 17 and much steeper at the mid-point of the space. This skew is due primarily to the flux fringing at the tooth edges 16, but is also affected by the relative size of the transducer with respect to the length of the rack tooth or space. In using the arrangement shown in FIG. 1a, difficulty is encountered in detecting the crossover point of the output voltage signal at mid-tooth, because of the small change in amplitude at point 18 with respect to displacement. Although the detection of tooth edges at the exact instant of passage is preferable, the signal of FIG. 1c may be interpreted to provide sufficient data if the tooth mid-point could be reliably detected from each tooth. The waveform of FiG. 1c can be further adversely affected by temperature changes and by vibration of the rack and transducer which alters the gap of the transducer and tooth. It thus becomes a nearly impossible task to accurately detect identical points on successive rack teeth.

Figure 2:
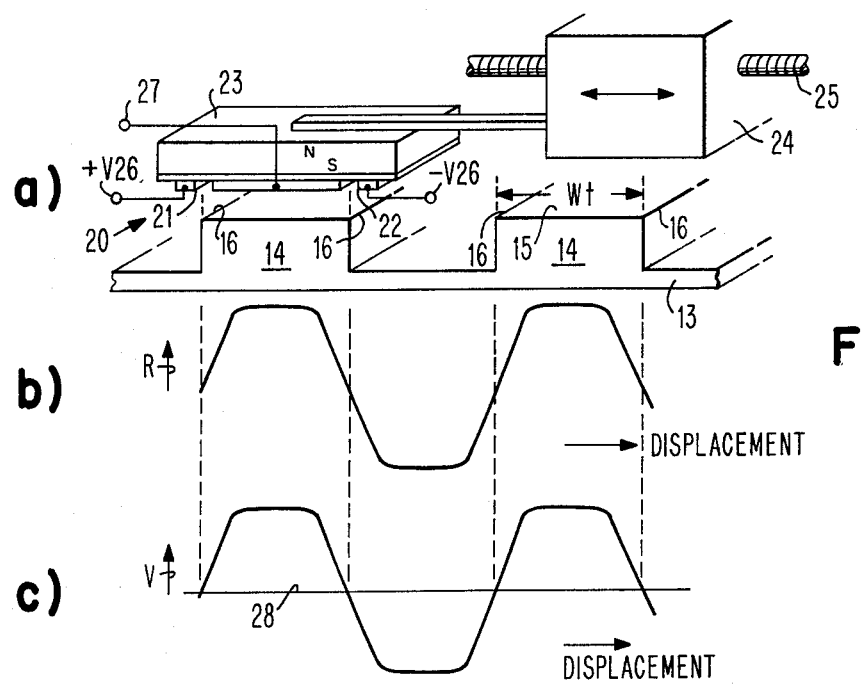
FIGS. 2a–2c are diagrams of the transducer arrangement constructed in accordance with the invention as used to sense displacement relative to rack teeth and the resulting resistance and voltage output changes produced thereby.
Figures 3A, 3B:
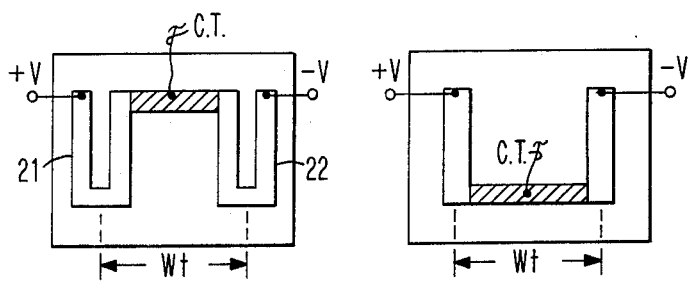
FIGS. 3a and 3b are diagrams of alternative magnetoresistive transducer configurations that may be used with the invention.

The transducer arrangement of the invention obviates these inaccuracies and is shown in FIGS. 2a–2c. The effect of flux fringing at the tooth edges is counteracted by providing transducer 20 having first and second sections 21, 22 separated by a tooth width or one-half the tooth pitch. Each section is symmetrically disposed about the half-pitch lines parallel with the tooth edges 16. Examples of the transducer arrangement are shown in FIGS. 3a and 3b. Other variations in section configurations such as serpentine shapes can be used to increase the total length and resistance of the transducer and are symmetrically disposed about the half-pitch line.

Returning to FIG. 2a, the transducer is supported on the underside of the permanent magnet 23 or other suitable magnetic flux generator which, in turn, is supported for movement relative to the rack 12 such as by a carriage 24 on a rotatable lead screw 25. The transducer is spaced from the top surface 15 of the teeth 14 for movement therealong and is connected at terminals 26 across a suitable voltage source (not shown). The transducer also has a center tap 27 serving as an output terminal at its mid-point. In the arrangement shown, movement in either direction along the rack will result in increasing the resistance of one section while decreasing that of the other so as to achieve a resistance variation that is symmetrical with respect to tooth edges. For example, when the transducer is moved to the right, its resistance variation will appear as in the waveform in FIG. 2b. The voltage output at center tap 27 will appear as the waveform shown in FIG. 2c. It will be seen in both FIGS. 2b and 2c that the resistance and voltage variations are symmetrical with respect to the teeth and spaces, and also above and below a selected reference value 28 along the abscissa. In the waveform of FIG. 2c the rate of change in the output voltage at the crossover point is much steeper than that shown in FIG. 1c and can be more reliably and accurately detected by the threshold circuits. In addition, no compensation or delay is necessary to transpose the electrical cross-over occurrence to the actual position of a tooth edge.

Figure 4:
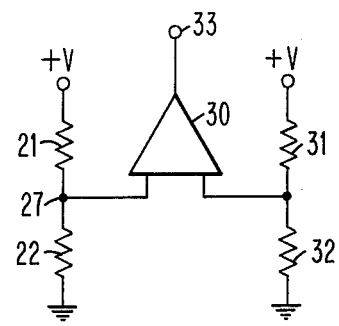
FIG. 4 is a diagram of a circuit arrangement for comparing relative impedances of magnetoresistive transducer sections with a standard.

A circuit arrangement suitable for producing a variable voltage output in accordance with rack tooth detection is shown in FIG. 4. This circuit employs a commercially available comparator module 30 including an operational amplifier and has a pair of signal input terminals: one input terminal is connected at the junction of two series-connected equal resistors 31, 32 and the other input terminal is connected at center tap 27 between two magnetoresistive sections 21 and 22 of the transducer in accordance with the invention. Resistors 31, 32 are each an approximate value of the corresponding transducer sections so that the positive and negative excursions of the comparator output signal at terminal 33 are approximately equal from selected reference value 28 of FIG. 2c. The comparator output signal can then be connected to suitable threshold circuits to provide signals such as square waves indicative of the detection of a rack tooth edge by the transducer.

The magnetoresistive portions of the transducer can be manufactured by etching such as used for printed circuit manufacture so that small sizes can be achieved. It is desirable for greater signal output of a comparator circuit that the magnetoresistive portions be lengthened if possible, by either a serially-connected plurality of two or more elongated strips or U-shape or serpentine configurations to obtain greater resistance. In certain instances, the tooth width may be relatively large compared to the required width of a transducer section so that there exists considerable open area between a connected pair of sections. This space can be efficiently used to form a vernier type detection transducer in which independent sets of transducer sections can be arranged to produce output signals at some fraction of the actual tooth width such as one-half or one-third of the width.

Figure 5:
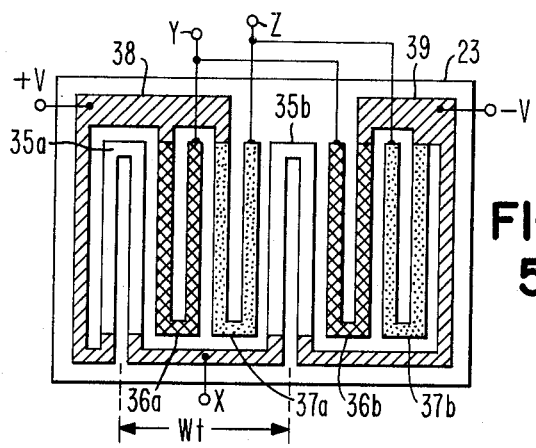
FIG. 5 is a diagram of three magnetoresistive transducers interdigitated for a compact arrangement useful for detecting displacements of fractional rack tooth amounts.

An example of such a transducer is shown in FIG. 5 in which three transducers 35, 36, and 37 are arranged each from a respective pair of U-shaped magnetoresistive sections 35a, 35b; 36a, 36b; and 37a, 37b. To more easily discern mating section pairs, the surfaces of sections 35a and 35b have been left unmarked, while the surfaces of sections 36a and 36b have been double crosshatched and sections 37a and 37b have been stippled. The plurality of transducers are commonly connected to voltage supply strips 38 and 39. The supply lines for the sections are coated or plated with an electrical conductor to reduce the resistance and are designated by cross-hatching. Each mating pair of sections is provided with a center tap output terminal labeled X, Y, and Z. Each of a mating pair of sections is symmetrically arranged about lines spaced a distance equal to one-half the tooth pitch or the width of a rack tooth $W_t$. The three independent transducers, when connected each to its comparator module such as that in FIG. 4, will provide output voltage waveforms similar to those shown in FIG. 6a, where each waveform is displaced 120° from each other. The two sections of each transducer are preferably approximately equal in resistance but it is not necessary that the resistances of one transducer equal those of another. The individual threshold detection devices can usually be adjusted for crossover values.

Figure 6:
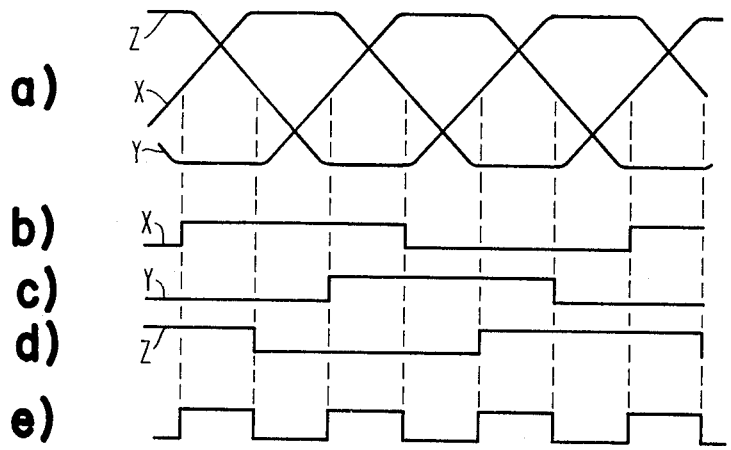
FIGS. 6a–6e are output signal diagrams of the transducer arrangement of FIG. 5 when used for detecting displacement along a toothed rack.
Figure 7:
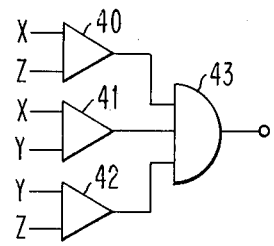
FIG. 7 is a logic circuit diagram for obtaining a succession of square waves when using the transducer arrangement of FIG. 5.

The waveforms of FIG. 6a can be applied through threshold detection devices to give a sequence of signal levels as indicated in FIGS. 6b, 6c, and 6d for the respective transducer outputs X, Y, and Z. By further combining these waveforms logically, the waveform of FIG. 6e can be obtained to divide the tooth pitch by six in which each rise or fall of a square wave indicates an increment of displacement equal to one-sixth of the tooth pitch. The circuit in FIG. 7 indicates a logical combination of the outputs of X, Y, and Z waveforms combined at AND gates 40–42 which are further combined at OR gate 43 to provide the waveform as shown in FIG. 6e.

Figure 8:
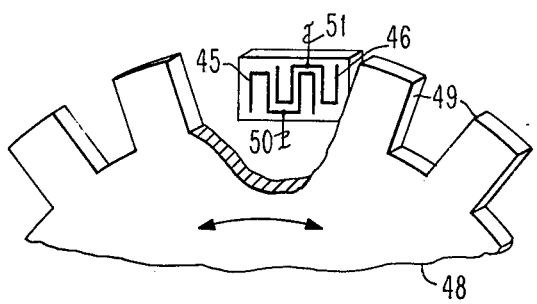
FIG. 8 is a schematic diagram of a transducer arrangement in accordance with the invention useful for detecting rotary displacement of a toothed member.

The transducer arrangement of FIGS. 2a and 5 can be readily adapted for detecting rotary displacement and one such embodiment is shown in FIG. 8. In this embodiment, two transducers 45, 46 each having a pair of mating magnetoresistive, interconnected U-shaped sections 45a, 45b and 46a, 46b are mounted on a permanent magnet 47 which is supported in a fixed position adjacent rotatable disk 48 having teeth 49. The disk may be moved in either direction. Transducers 45, 46 are connected in parallel across a voltage source and each mating pair of transducer sections is joined at a center tap 50, 51 for the output signal. The rotatable disk is made of a ferromagnetic material but needs to be only a fraction of a millimeter thick, for example, from 0.5 mm or less in order to provide the necessary flux field. The teeth 49 are preferably constructed with parallel edges rather than edges formed along a radius of the disk. The rectangular teeth accomplish more nearly the simultaneous eclipsing of the pair of transverse transducer sections by the tooth edges. It will be noted that as the ratio of tooth height to disk radius is decreased the error is also decreased. Since the disk can be made of thin ferromagnetic material, the transducer arrangement shown in FIG. 8 is attractive because of low enertia for the disk driving source.

Figure 9:
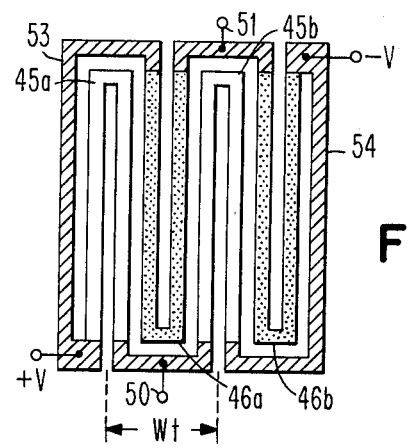
FIG. 9 is a schematic diagram showing in greater detail the transducers of FIG. 8.

The transducers shown schematically on the face of the magnet 47 of FIG. 8 are shown in greater detail in FIG. 9. The sections are U-shaped but may be of other configuration. U-shaped sections 45a and 45b form one transducer while stippled sections 46a and 46b form the second transducer. Voltage supply strips 53, 54 may be plated to provide low impedance leads to the appropriate sections to thereby equalize the resistance of each of the paired sections. The supply strips are cross-hatched for identity.

The invention has previously been described using a bridge circuit with two active arms, but it is obvious that it can be extended to four active arms using the disclosed techniques, when temperature coefficients are small. The transducer arrangements, of course, can be varied in size and proportion to conform to installation requirements.

While the invention has been particularly shown and described with reference to preferred embodiments thereof, it will be understood by those skilled in the art that the foregoing and other changes in form and details may be made therein without departing from the spirit and scope of the invention.

What is claimed is:

1. Transducer apparatus for detecting displacement comprising:
    a member of magnetic material formed with at least one pole face having a pair of parallel edges;
    means for producing a magnetic flux field at said pole face;
    transducer means on said magnetic flux means movable transversely with respect to said edges and in a plane parallel to said pole face, said transducer means including a plurality of transducers, each transducer having first and second interconnected sections of magnetoresistive material in a common plane parallel with said pole face and each said section of a transducer having a longitudinal axis parallel with said edges and spaced from the other section a distance equal to that between said edges, and each pair of sections having disposed therebetween a section from at least one other transducer; and
    means for detecting changes in resistance of said sections of said transducers as a function of the movement of said transducer means along a plane parallel with said pole face.

2. Apparatus as described in claim 1 wherein said transducer means is secured to said field producing means for movement therewith and said member includes a plurality of serially arranged pole faces.

3. Apparatus as described in claim 1 wherein said transducer means includes three transducers with each pair of said transducer sections having therebetween one section of each of said other two transducers.

4. Displacement detection transducer apparatus comprising:
    a member having a plurality of teeth of magnetic material spaced therealong at a predetermined pitch;
    magnetic flux producing means;
    means for supporting said member and said flux producing means adjacent to one another for relative movement therebetween;
    a plurality of transducers mounted on said magnetic flux producing means adjacent said member and each having first and second serially connected sections, each said section including at least two parallel, serially connected elements of magnetoresistive material symmetrically disposed about a longitudinal axis one-half tooth pitch from longitudinal axis of the elements of the other section of a said transducer pair, said axes extending transversely of the direction of relative motion and each said serially connected pair of transducer sections having disposed therebetween at least one section of each of the others of said transducers; and
    means for detecting changes in resistance of said sections of said transducers as a function of the movement of said flux producing means, with all of said transducers reaching maximum and minimum resistance values during relative movement of one tooth pitch.

* * * * *